(12) United States Patent
Kim et al.

(10) Patent No.: US 8,115,301 B2
(45) Date of Patent: Feb. 14, 2012

(54) METHODS FOR MANUFACTURING THERMALLY ENHANCED FLIP-CHIP BALL GRID ARRAYS

(75) Inventors: KyungOe Kim, Kyoungki-do (KR); YoungJoon Kim, Kyoungki-do (KR); HyunSoo Shin, Kyoungki-do (KR)

(73) Assignee: STATS ChipPAC, Inc., Fremont, CA (US)

( * ) Notice: Subject to any disclaimer, the term of this patent is extended or adjusted under 35 U.S.C. 154(b) by 0 days.

(21) Appl. No.: 11/601,103

(22) Filed: Nov. 17, 2006

(65) Prior Publication Data

US 2008/0116586 A1 May 22, 2008

(51) Int. Cl.
*H01L 23/10* (2006.01)
*H01L 23/34* (2006.01)
*H01L 21/00* (2006.01)

(52) U.S. Cl. ........ 257/706; 257/704; 257/707; 257/718; 257/E23.101; 257/E23.102; 438/108; 438/122; 438/125

(58) Field of Classification Search ............ 257/706, 257/778, 705, 707, 712, 718, 719, 720, E23.101, 257/E23.102, E23.103, E23.104, 704, 717, 257/796, E23.051, E23.087
See application file for complete search history.

(56) References Cited

U.S. PATENT DOCUMENTS

| | | | | |
|---|---|---|---|---|
| 5,909,057 | A * | 6/1999 | McCormick et al. | 257/704 |
| 6,232,652 | B1 * | 5/2001 | Matsushima | 257/667 |
| 6,472,762 | B1 * | 10/2002 | Kutlu | 257/778 |
| 6,617,682 | B1 * | 9/2003 | Ma et al. | 257/706 |
| 2004/0229399 | A1 * | 11/2004 | Chen et al. | 438/108 |
| 2005/0116335 | A1 * | 6/2005 | Karim | 257/718 |
| 2005/0134507 | A1 * | 6/2005 | Dishongh et al. | 343/700 MS |
| 2006/0043553 | A1 * | 3/2006 | Yang et al. | 257/678 |
| 2006/0091528 | A1 * | 5/2006 | Yang | 257/706 |
| 2006/0202326 | A1 * | 9/2006 | Huang et al. | 257/718 |
| 2006/0205118 | A1 * | 9/2006 | Hwang et al. | 438/122 |

OTHER PUBLICATIONS

"Trends in Package Development: FCBGA (Flip Chip Ball Grid Array)," NEC Electronics, http://www.necel.com/pkg/en/pk02_03.html, 2006.

* cited by examiner

*Primary Examiner* — Minh-Loan T Tran
*Assistant Examiner* — Leslie Pilar Cruz

(57) ABSTRACT

Methods for fabricating flip-chips are disclosed. In an exemplary method, a flip-chip is mounted, active-surface downward, onto a substrate such that a back-side of the flip-chip is facing upward and electrical connections are made between the chip and an upward-facing surface of the substrate. An adhesive is applied to selected regions not occupied by the flip-chip. A heat-spreader is applied to contact the applied adhesive without contacting the back-side of the flip-chip, leaving a gap between the heat-spreader and the back-side of the flip-chip. The heat-spreader defines at least one through-hole that, when the heat-spreader is placed, is within a perimeter of the flip-chip. The adhesive is cured, and a thermal-insulating material (TIM) is applied through the at least one through-hole so as to fill the gap with the TIM. The methods substantially reduce the probability of die damage that otherwise occurs during attachment of heat-spreaders.

19 Claims, 11 Drawing Sheets

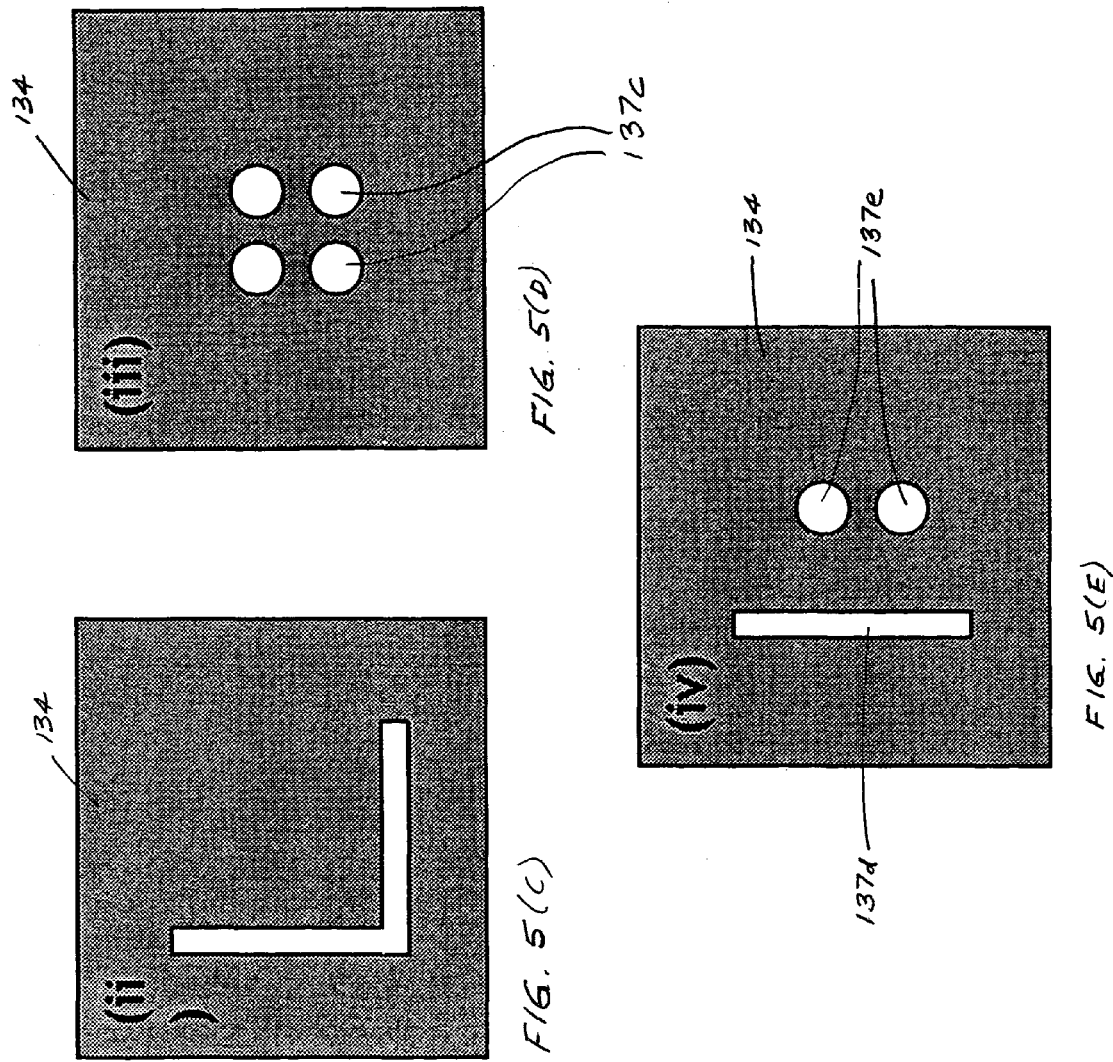

METHODS FOR MANUFACTURING THERMALLY ENHANCED FLIP-CHIP BALL GRID ARRAYS

FIELD

This disclosure is directed to, inter alia, methods for fabricating semiconductor integrated circuits and other microelectronic devices. More specifically, the disclosure pertains to methods for mounting a semiconductor "chip," or "die," to a substrate in a manner that provides physical support for the chip and facilitates the formation of electrical connections to and from the chip, via the substrate, to interconnect the chip to other chips and/or to other micro-electronic circuits.

BACKGROUND

Chip packaging is normally the final process in the long chain of processes for manufacturing semiconductor integrated circuits. Chip packaging is a multi-disciplinary technology that typically involves many steps. The technology is critically important because it has a direct impact on chip performance and reliability as well as the performance and reliability of electronic devices in which the chips are incorporated. "Packaging" as used herein encompasses any of various conventional techniques of preparing a chip (also called a "die") for actual use in an electronic device. In many instances, packaging involves, basically, encapsulating the die in a manner that seals and protects the die from the external environment and provides the required external electrical connections (called "I/O" connections) from the die to other circuitry. Packaging also can facilitate the conduction of heat away from the die during use. Other types of packaging may simply involve mounting the die on a substrate or carrier, with which the die makes the required I/O connections, without forming a discrete capsule around the individual die beforehand. Since die encapsulation consumes space, this latter packaging method is typically used in applications in which size is critical, such as electronic watches, hearing aids and other medical devices, cellular phones and other personal communication equipment, lap-top and palm-top personal computers, and high-speed microprocessors.

The current disclosure is directed in general to the physical and electrical attachment of a die to a substrate. The electrical connections provide at least some of the required I/O connections of the die to the world outside the die.

Wire bonding has, for many years, been a "workhorse" technology for making electrical connections between I/O bond-pads on the die and I/O bond-pads on the package or other die-mounting substrate. However, wire bonding has several disadvantages. First, it typically is performed serially, pad-by-pad, which is inherently slow and thus decreases throughput. Second, as the number of I/O connections to an integrated circuit (e.g., memory or microprocessor chip) has increased, increasingly larger numbers of I/O bond-pads on the die are required. Providing a larger number of such pads without excessively increasing the size of the chip usually requires a corresponding decrease in the pitch (i.e., a finer pitch) of I/O bond-pads on the die. These factors, as well as other factors, have increased the difficulty and decreased the reliability of using wire bonds, which has led to much interest in alternative methods of making I/O connections to individual dies.

Key alternative methods are derived from the so-called "flip-chip" technology. Flip-chip involves the assembly of a die to a substrate or carrier in a face-down manner, usually by using electrically conductive "bumps" formed on the I/O bond-pads of the die. ("Face-down" means that the die surface on which the circuit layers are formed actually faces the substrate to which the die is attached. Wire-bonding, in contrast, is performed on face-up dies). Flip-chip methods made their debut in the mid-1960s but did not achieve widespread utilization for many years largely because wire-bonding was the norm. With the advent of extremely complex integrated circuits requiring large numbers of I/O connections, flip-chip methods have become attractive. Currently, flip-chip components are predominantly semiconductor devices such as integrated circuits, memories, signal processors, and microprocessors; however, flip-chip methods are also being used increasingly with other types of micro-electronic devices as well, such as passive filters, detector arrays, and MEMs devices. Flip-chip is also termed "direct chip attach" (abbreviated DCA), which is perhaps a more descriptive term because the die is attached directly to the substrate, carrier, or the like by the conductive bumps. DCA has allowed, in many instances, elimination of a conventional "package" entirely.

Among the various conventional flip-chip methods, the most common technique is the "solder-bump" technique that forms a small, individual solder bumps (typically roughly spherical in shape) on the I/O bond-pads of the die. After formation of the solder bumps, the wafer is diced into "bumped dies." An individual bumped die is placed on a substrate or carrier (generally termed a "substrate"), with the "active" surface (on which the circuit layers were formed) of the die facing the substrate. The assembly is heated to cause the solder bumps to form solder connections between the die and the I/O bond-pads on the substrate. After forming these solder bridges, "underfill" (usually an epoxy adhesive) typically is added between the die and the substrate.

In flip-chip methods, due in part to the substantially shortened pathways of the I/O interconnections of the die with the substrate, increases in operational speed of the dies in finished micro-electronic devices have been realized. This increase in speed has unfortunately resulted in increased heat production by the die. To avoid thermal damage to the die, the heat must be removed in some manner. Some flip-chip circuits achieve heat removal by simple conduction from the die to the substrate and beyond. Whereas this method is satisfactory for some dies, it has limitations for other dies, especially large and complex dies configured for high-speed use. In addition, the substrate and die typically have substantially different coefficients of thermal expansion, which can result in concentration of large stresses on the die between the substrate and/or the solder bumps, especially after repeated thermal cycles. These stresses can result in physical damage to the die, the substrate, and/or the solder interconnections between the two.

A conventional way in which to improve heat conduction from a flip-chip die is to attach a heat-sink or "heat-spreader" (also called an "H/spreader") to the upward-facing back-side of the die. One conventional method for doing this is shown in FIG. 7, in which the left-hand portion of the figure is a block diagram of the method, and the right-hand portion of the figure depicts the results of the respective steps. In the first step 10 (stiffener attach & spot cure) a stiffener "ring" 12 is attached to the substrate 14 using an adhesive 16. The adhesive is "spot cured," by which is meant a curing stimulus (e.g., heat or radiation) is generally applied only to the adhesive 16 and not elsewhere on the structure. Other features shown in the top right-hand diagram are the die 18 (with active surface facing downward) connected by smaller solder balls 22 to the upper surface of the substrate 14; larger solder balls 24 intended to connect the substrate later to other structure (not shown), and underfill 26. The depicted structure is referred in the art as a "flip-chip ball grid array," abbreviated "fcBGA." In the next step 20 (adhesive dispense), an adhesive 28 is applied to the top surfaces of the stiffener ring 12. In the next step 30 (TIM dispense), before the adhesive 28 is cured, thermally conductive adhesive (also called a "thermal-interface material" or "TIM") 32 is applied to the upward-facing ("top") surface of the die 18. In the next step 40 (H/spreader attach), the heat-spreader 34 is placed on the TIM 32 and on the adhesive 28. In the last step 50 (press & cure), downward pressure is exerted on the heat-spreader 34, and the adhesive 28 is cured. (Note that the respective layer thicknesses of the TIM 32 and adhesive 28 are less in the figure corresponding to step 50 than in the figure corresponding to step 40.)

A larger image of the result of step 50 is shown in FIG. 8(A), in which also can be seen a "lower" conductive layer 36 providing I/O bond-pads (not detailed) for the larger solder balls 24 on the lower surface of the substrate 14, an "upper" conductive layer 38 providing I/O bond-pads (not detailed) for the smaller solder balls 22, vias 42 connecting the upper conductive layer 38 to the lower conductive layer 36, and the core material 44 of the substrate 14. In FIG. 8(A) the heat-spreader 34 is substantially planar (called a "Type I" heat-spreader), and is desirably attached to the substrate 14 using the stiffener ring 12. In FIG. 8(B) the heat-spreader 34a has an inverted-U profile (called a "Type II" heat-spreader, which allows its attachment to the substrate 14 using the adhesive 28 but without using the stiffener ring 12.

Another approach is disclosed in published U.S. Patent Application No. 2004/0229399 A1, incorporated herein by reference. In the '399 application, after flipping the die and attaching its solder bumps (on the active surface of the die) to the substrate, the heat-spreader is mounted to the back-side of the die using a TIM. Specifically, a dollop of TIM is applied to the back-side of the die, followed by press-placement of the heat-spreader on the dollop. The resulting bond-line thickness of the TIM depends on the particular TIM material (e.g., viscosity and pot-life) and the applied pressing force. A stiffener ring surrounding the die on the substrate can be used to provide further mechanical support for the heat-sink. If required, the TIM can be treated (e.g., cured) to facilitate adhesion of the heat-spreader to the die. Then, underfill material (epoxy resin) is applied at least to fill the space between the substrate and the die. For application of the underfill resin, the heat-spreader defines at least one through-hole through which the resin is introduced. Sufficient epoxy resin can be added not only to fill the space between the substrate and the active surface of the die but also to form an epoxy fillet around the edge of the die from the substrate to the heat-spreader. Then, the underfill adhesive is cured.

Unfortunately, the conventional methods summarized above exhibit some adverse characteristics. First, for example in the '399 application, the manner of attaching the heat-spreader to the die, namely by applying a dollop of TIM to the back-side of the die followed by press-placement of the heat-spreader onto the dollop, often entraps significant amounts of air, resulting in formation of air voids between the TIM and the heat-spreader and/or between the back-side of the die and the TIM. This entrapped air is not visible externally, is easily entrapped, and is difficult to expel, especially in automated processes. Since the rate of thermal conduction through an air void is substantially lower than the rate of thermal conduction through the TIM, the heat-removal effectiveness of the heat-spreader can be seriously compromised by this problem. Also, application of excessive pressure when press-placing the heat-spreader to the dollop of TIM can fracture or otherwise damage the die and/or the solder connections between the die and substrate. In addition, one or more particles becoming entrapped in the TIM can focus stress on the die and cause the die to crack or break. Similar problems are manifest with the other conventional method summarized above and shown in FIG. 7.

In view of the foregoing, improved methods are needed for mounting heat-spreaders to fcBGA dies.

SUMMARY

The various shortcomings of conventional methods are addressed by methods and devices as disclosed herein.

According to a first aspect, methods are provided for fabricating a flip-chip. An embodiment of such a method comprises mounting a flip-chip, active-surface facing downward, onto a substrate such that a back-side of the flip-chip is facing upward and requisite electrical connections are made between the chip and an upward-facing surface of the substrate. In another step an adhesive is applied to selected regions not occupied by the flip-chip. In another step a heat-spreader is placed so as to contact the applied adhesive without contacting the back-side of the flip-chip, thereby leaving a gap between the heat-spreader and the back-side of the flip-chip. The heat-spreader defines at least one through-hole that, when the heat-spreader is placed, is situated within a perimeter of the flip-chip. In another step the adhesive is cured. In another step a thermal-interface material (TIM) is applied through the at least one through-hole so as to fill the gap with the TIM.

As used herein, "curing," "cure," and "cured" are not limited to adhesives or other substances that require a curing stimulus (e.g., heat or radiation) to harden or otherwise form adhesive bonds having sufficient strength. These terms also encompass processes such as "drying," "setting," "hardening," "cooling," and the like as applied to adhesives and the like that do not require a stimulus. For example, some adhesives spontaneously "harden" or otherwise assume a form that provides the desired state of adhesion.

Any of the method embodiments can further comprise, during the step of mounting the flip-chip onto the substrate, applying an underfill material at least between the active-surface and the substrate.

In any of the method embodiments the step of mounting the flip-chip onto the substrate further can comprise making solder connections between the active-surface of the flip-chip and the substrate.

In any of the method embodiments the step of mounting the flip-chip onto the substrate can further comprise applying solder balls to selected locations on the active surface of the flip-chip to produce a ball-grid array on the active surface, and causing the solder balls to form respective connections to corresponding locations on the upward-facing surface of the substrate.

Any of the method embodiments further can comprise, during the step of curing the adhesive, pressing the heat-spreader toward the back-side of the flip-chip but not contacting the back-side, thereby retaining the gap.

Any of the method embodiments further can comprise, before or after mounting the flip-chip onto the substrate, attaching a stiffener to the substrate at a location outside the perimeter of the chip. The stiffener can be, and desirably is, attached to the substrate using an adhesive. Hence, the step of applying an adhesive to selected regions can comprise applying the adhesive to a top surface of the stiffener attached to the substrate, wherein the step of placing the heat-spreader comprises placing the heat-spreader so as to contact the applied adhesive on the top-surface of the stiffener.

In any of the method embodiments the step of applying an adhesive to selected regions can comprise applying the adhesive to selected regions of the upward-facing surface of the substrate.

According to another aspect, methods are provided for attaching a heat-spreader to a flip-chip. An embodiment of such a method comprises, with respect to a flip-chip that has been mounted, active-surface facing downward, onto an upward-facing surface of a substrate such that a back-side of the flip-chip is facing upward, applying an adhesive to selected regions not occupied by the flip-chip. In another step a heat-spreader is placed so as to contact the applied adhesive without contacting the back-side of the flip-chip, thereby leaving a gap between the heat-spreader and the back-side of the flip-chip. The heat-spreader defines at least one through-hole that, when the heat-spreader is placed, is situated within a perimeter of the flip-chip. In another step the adhesive is cured. In another step a TIM is applied through the at least one through-hole so as to fill the gap with the TIM.

According to another aspect, flip-chips are provided. An embodiment of such a flip-chip comprises a chip comprising a first surface and an active second surface. The flip-chip also comprises a substrate having a first surface and a second surface, wherein the chip is mounted, in a flip-chip manner, onto the substrate such that the active second surface of the chip is facing the first surface of the substrate, and electrical connections are formed between the active second surface of the chip and the first surface of the substrate. The flip-chip also comprises a heat-spreader that defines at least one through hole and that is coupled to the first surface of the chip and to the first surface of the substrate such that the at least one through-hole is situated within a perimeter of the chip and a gap is defined between the chip and the substrate. TIM is situated within the gap so as to form a thermal connection between the chip and the heat-spreader.

In any of the flip-chip embodiments the electrical connections can comprise a ball-grid array.

In any of the flip-chip embodiments the heat-spreader can define multiple through-holes each situated within the perimeter of the chip.

Any of the flip-chip embodiments further can comprise a stiffener situated between and mounted to the first surface of the heat-spreader and the first surface of the substrate outside the perimeter of the chip. Such a flip-chip further can comprise a first adhesive situated between the stiffener and the first surface of the substrate and a second adhesive situated between the stiffener and the heat-spreader. The heat-spreader in these embodiments can be a Type I heat-spreader.

In any of the flip-chip embodiments the stiffener can be coupled directly to the first surface of the substrate using an adhesive. The heat-spreader in these embodiments can be a Type II heat-spreader.

According to yet another aspect, electronic devices are provided that comprises a flip-chip according to any of the embodiments summarized above.

The foregoing and additional features and advantages of the subject methods, and of devices made thereby, will be more readily apparent from the following detailed description, which proceeds with reference to the accompanying drawings.

BRIEF DESCRIPTION OF THE DRAWINGS

FIGS. 5(C)-5(E) are plan views of respective heat-spreaders with different exemplary configurations of through-holes that can be used in the instant methods.

DETAILED DESCRIPTION

The subject methods and devices are set forth below in the context of representative embodiments that are not intended to be limiting in any way.

Preliminary Considerations

Figure 1A:
FIG. 1(A) is a half-tone of a photograph showing air voids in TIM on the die side.
Figure 1B:
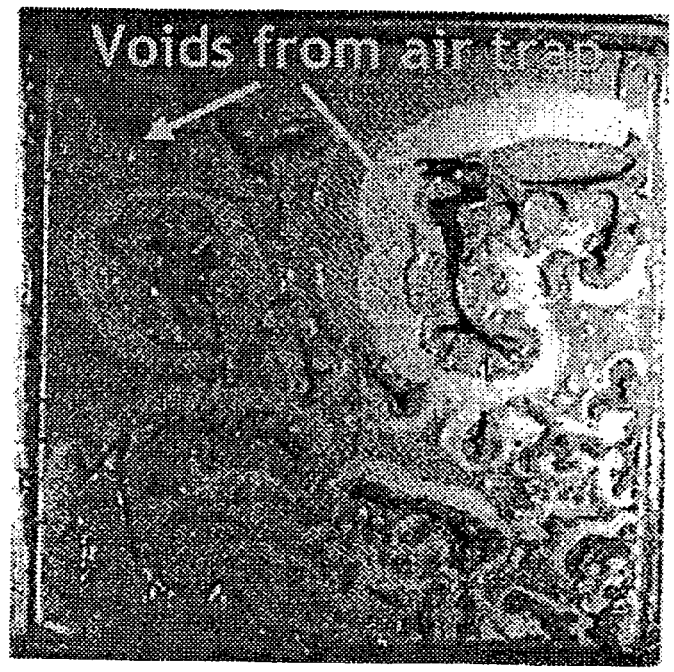
FIG. 1(B) is a half-tone of a photograph showing air voids in TIM on the heat-spreader side.

As discussed above, the conventional methods of attaching a heat-spreader to a flipped-chip ball grid array often results in air bubbles forming or being captured in the TIM. The air can be trapped on the die side of the TIM and/or on the heat-spreader side. Exemplary images of entrapped air in the TIM on the die side and on the heat-spreader side are in FIGS. 1(A)-1(B), respectively. Note that the entrapped air essentially forms voids in which the TIM is absent. Since the voids conduct heat from the die much more poorly than the TIM, the thermal-conduction efficacy of the TIM is substantially compromised whenever any significant amount of air becomes entrapped in the TIM. If air becomes entrapped on both sides (both the die side and heat-spreader side), then the thermal-conduction efficacy of the TIM is even more compromised. Of course, once the air is entrapped in the TIM, the air tends to remain so. Attempting to purge the air by pressing the heat-spreader toward the die poses a high risk of damaging the die or the substrate or the solder balls on the flip-chip ball grid array (fcBGA).

Figure 2:
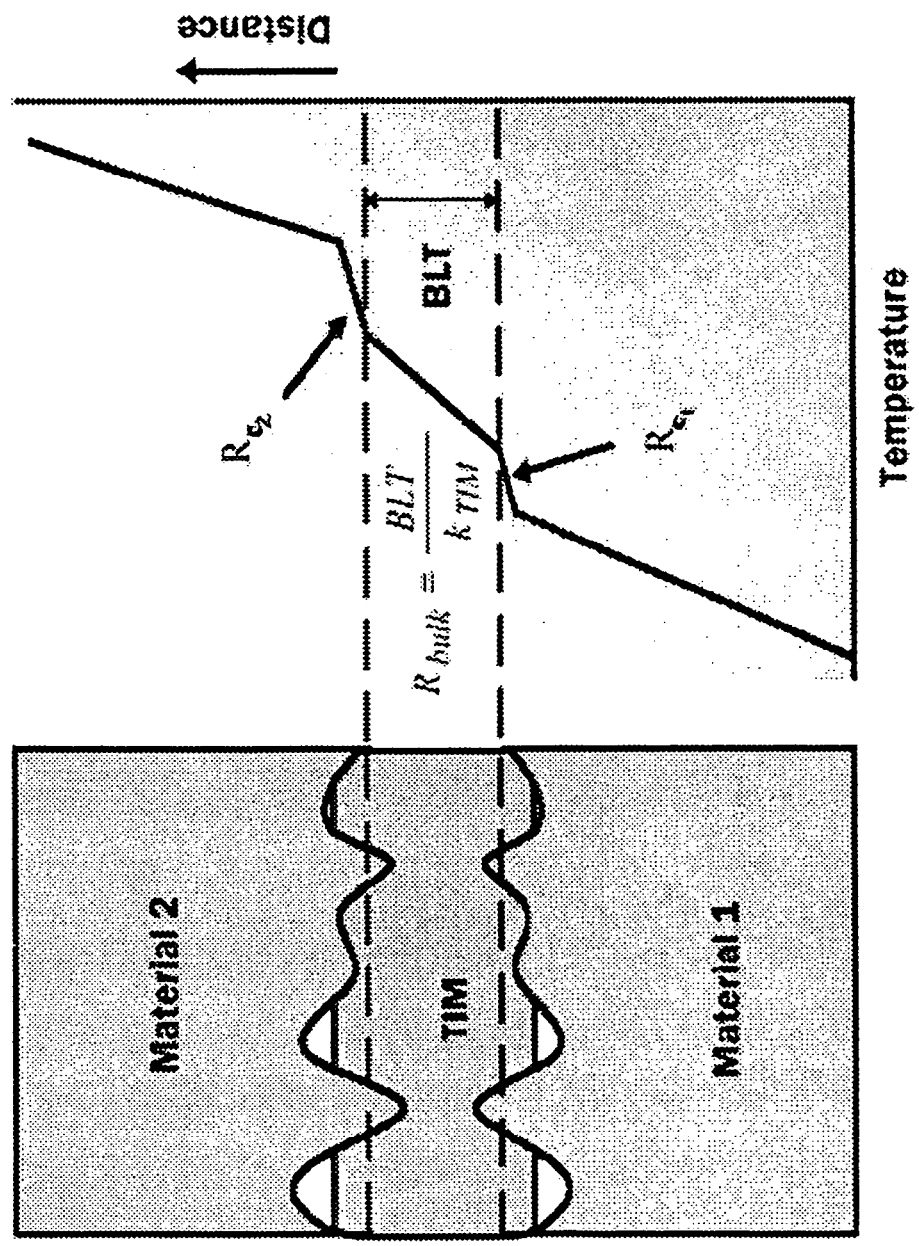
FIG. 2 provides graphs showing thermal effects of air voids such as shown in FIGS. 1(A) and 1(B).

The results of conventional methods are shown more graphically in FIG. 2. On the left-hand side of the figure, "material 1" can be the die, and "material 2" can be the heat-spreader. Note the presence of the TIM between the two materials. This situation has been analyzed as follows. Let $R_{c1}$ be the contact resistance at the interface of the TIM and material 1, and let $R_{c2}$ be the contact resistance at the interface of the TIM and material 2. Let BLT be the bond-line thickness (wherein the bond-line thickness is controllable, depending upon the TIM material and pressing force applied to the heat-spreader toward the die). The bulk resistance $R_{bulk}$ is expressed as follows:

$$R_{bulk} = \frac{BLT}{k_{TIM}}$$

wherein $k_{TIM}$ is a factor that depends upon the properties of the TIM. Note that $R_{c1}$ and $R_{c2}$ depend upon the trapped-void ratio between the TIM and material 1 and between the TIM and material 2, respectively. The improved methods disclosed herein are directed to, inter alia, reducing $R_{c1}$ and $R_{c2}$ to improve the thermal performance of the heat-spreader on the fcBGA.

Representative Embodiments

The following description may include words of position, such as "up," "down,", "upper," "lower," "back-side," "top-side," "above," "below," and the like to facilitate ease of understanding relative positions of things. However, it will be understood that these words are not to be regarded in a strictly limited manner because, by changing the orientation of the structure being referred to, an "upper" surface may become a "lower" surface, for example. The same applies to the claims.

Figure 3:
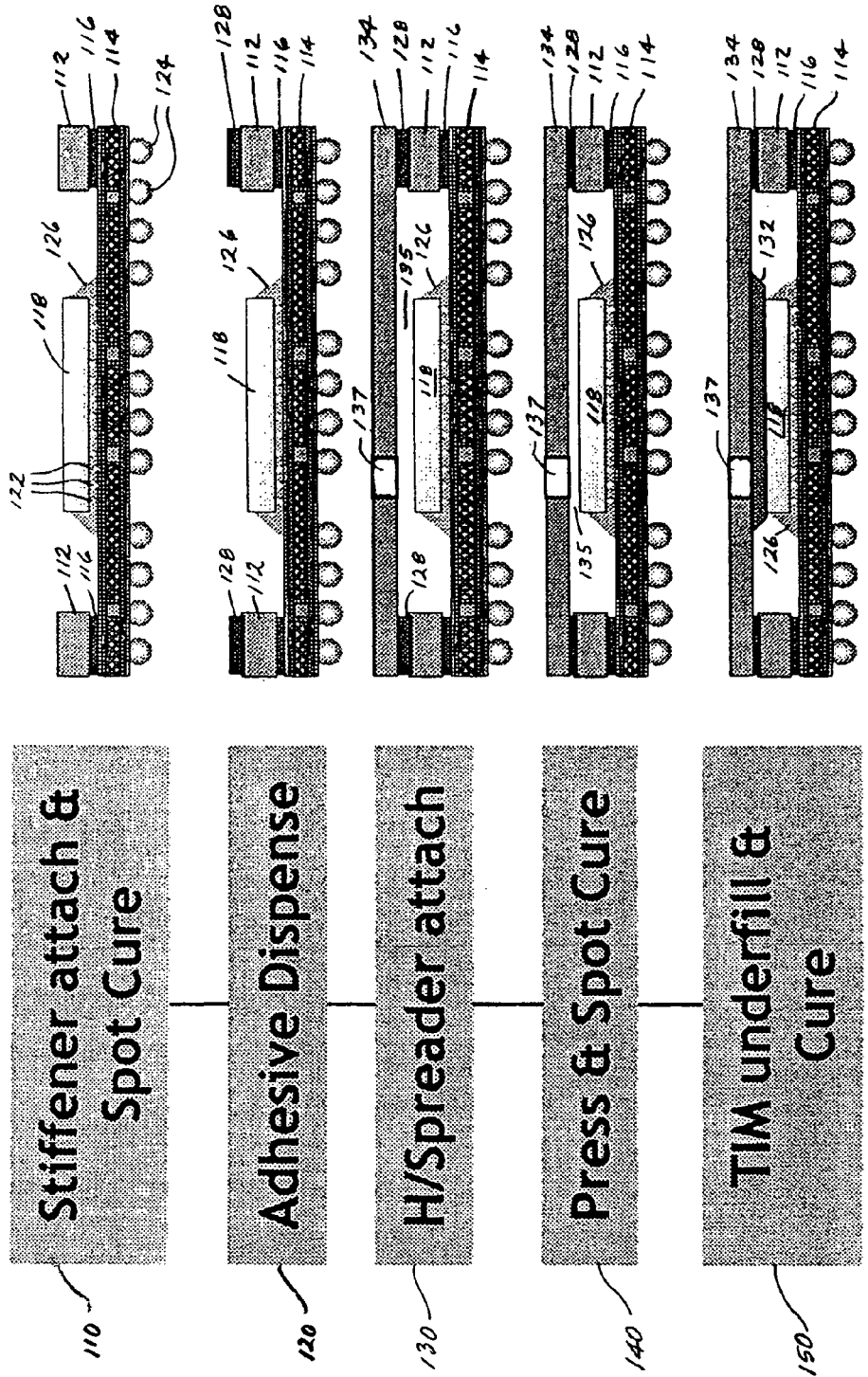
FIG. 3 provides, on the left side, a block-diagram flow chart of a representative embodiment of a method for attaching the heat-spreader to the substrate and top surface of the die without pressing the heat-spreader directly onto the die. On the right side are schematic vertical sections depicting the results of respective steps of the method.

A representative embodiment is depicted in FIG. 3, in which the left-hand side is a block diagram of steps of the method, and the right-hand side depicts the results of the respective steps as performed on an fcBGA. An example of the fcBGA includes an integrated circuit package having a flip-chip. In the first step 110 (stiffener attach & spot cure) a stiffener ring 112 is attached to the substrate 114 using an adhesive 116. The adhesive is "spot cured," by which is meant a curing stimulus (e.g., heat or radiation) is applied only to the adhesive 116 and not elsewhere on the structure. Other features shown in the top right-hand diagram are the die 118 (with active surface facing downward) connected by smaller solder balls 122 to the upper surface of the substrate 114; larger solder balls 124 intended to connect the substrate to other structure (not shown), and underfill 126. In the next step 120 (adhesive dispense), an adhesive 128 is applied to the top surfaces of the stiffener ring 112. In the next step 130 (H/spreader attach), the heat-spreader 134 is placed on the adhesive 128, leaving a gap 135 between the die 118 and the heat-spreader 134. Note that the heat-spreader 134 defines at least one through-hole 137 situated over a region of the die 118. In the next step 140 (press & spot cure), the heat-spreader 134 is pressed lightly toward the die 118, and the adhesive 128 is cured. (Note that the layer thickness of the adhesive 128 is less in the figure corresponding to the step 140 than in the step 130, and the gap 135 is narrower in the figure corresponding to step 140.) The heat-spreader 134 is not pressed so hard as to actually contact the die 118. In other words, the gap 135 is retained, which prevents any damage to the die 118 or to its solder connections resulting from pressing the heat-spreader 134 onto the die. In the last step 150 (TIM underfill & cure), TIM 132 is introduced via the through-hole to fill the gap 135. The TIM 132 is introduced at a controlled rate to fill the gap 135 thoroughly without entrapping air or otherwise forming any voids. The volume of applied TIM 132 is also limited to retain the TIM in the gap 135 and thus prevent the TIM from flowing down the edges of the die 118. If desired, some TIM 132 can remain in the through-hole 137.

After adding the TIM 132, if the TIM is a type that requires curing for effectiveness, it can be subjected to a curing condition. (Other types of TIM do not require curing.)

The respective materials and specifications of the substrate 114, the stiffener ring 112, the adhesive 116, the die 118, the solder balls 122, 124, the underfill 126, the adhesive 128, the TIM 132, and the heat-spreader 134 are well-known in the art.

Figure 4A:
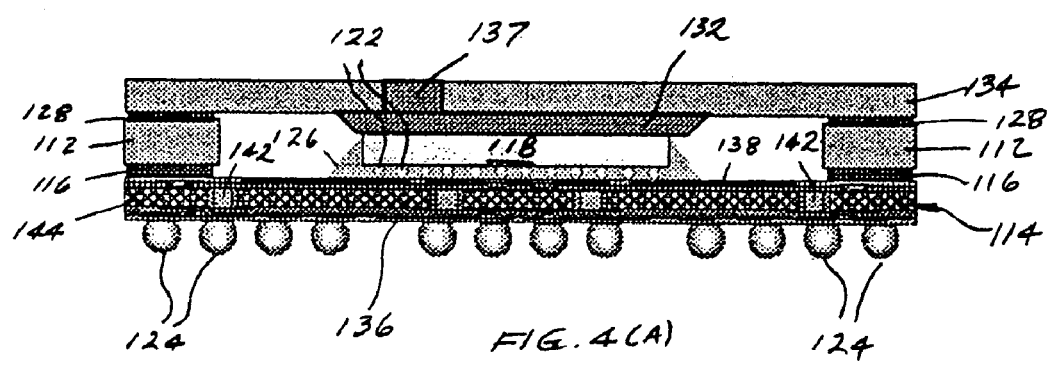
FIG. 4(A) depicts, in larger form, the result of step 150 of the method of FIG. 3, performed with a Type I (planar) heat-spreader.

A larger image of the result of step 150 is shown in FIG. 4(A), in which also can be seen a "lower" conductive layer 136 providing I/O bond-pads (not detailed) for the larger solder balls 124 on the lower surface of the substrate 114, an "upper" conductive layer 138 providing I/O bond-pads (not detailed) for the smaller solder balls 122, vias 142 connecting the upper conductive layer 138 to the lower conductive layer 136, and the core material 144 of the substrate 114. In FIG. 4(A) the heat-spreader 134 is substantially planar "Type I" heat-spreader and is attached to the substrate 114 using the stiffener ring 112.

Figure 4B:
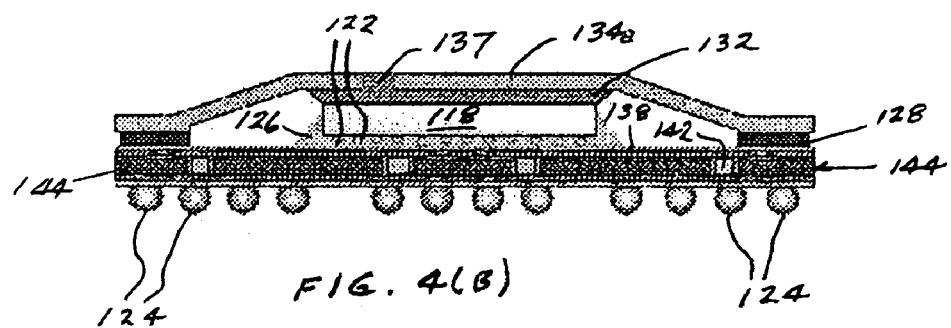
FIG. 4(B) depicts, in larger form, the result of step 150 of the method of FIG. 3, performed with a Type II (inverted U-shaped) heat-spreader.

In FIG. 4(B) the heat-spreader 134a has an inverted-U profile characteristic of a Type II heat-spreader, which allows its attachment to the substrate 114 using the adhesive 128 but without having to use the stiffener ring 112. Thus, referring to the method of FIG. 3, when attaching a Type II heat-spreader, step 110 can be omitted.

Distinctive advantages of this method include: (a) no direct pressure on the die is needed, so process yield is correspondingly improved because there is less damage to product, and (b) voids in the TIM are prevented, which yields better and more consistent heat dissipation from the die to the heat-spreader.

Figure 5A:
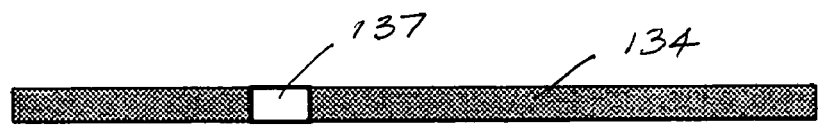
FIG. 5(A) is a side sectional view of a Type I heat-spreader including an exemplary through-hole used in the instant methods.
Figure 5B:
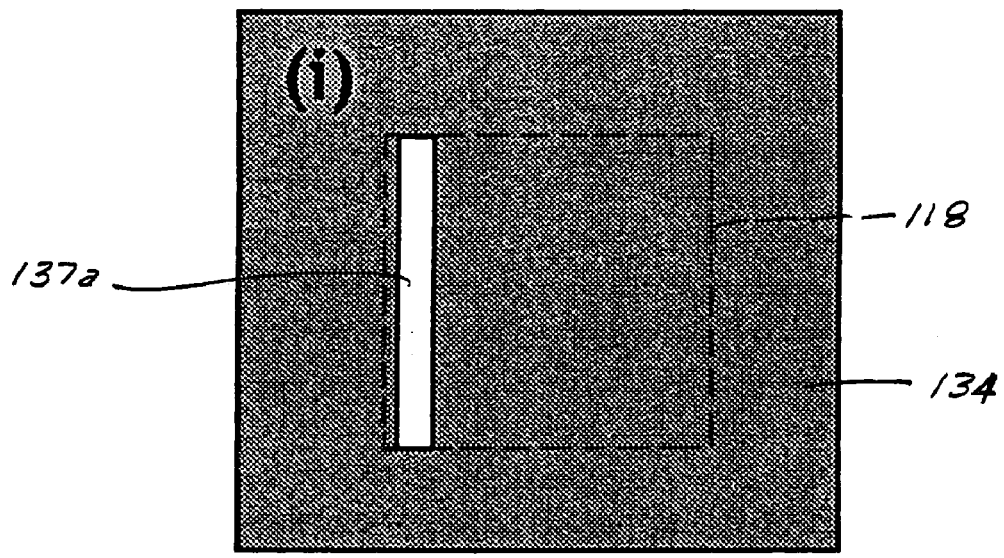
FIG. 5(B) is a plan view of the heat-spreader in FIG. 5(A).

FIG. 5(A) depicts a side view of an exemplary Type I heat-spreader 134. A through-hole 137 is shown. A plan view is shown in FIG. 5(B), which depicts an exemplary longitudinal through-hole (now denoted as item 137a). Note the approximate position of the through-hole 137a relative to the outline of the die 118 situated underneath. The longitudinal through-hole 137a has a side formed by the heat-spreader 134 that is parallel to the backside and outline of the die 118. The side of the through-hole 137a can extend across the entire lateral dimension of the die 118. Introducing the TIM via the through-hole 137a to the die 118 allows even and thorough flow of the TIM into the entire gap 135 between the die and the heat-spreader 134. Whereas FIG. 5(B) depicts one exemplary through-hole, other possible configurations comprise multiple through-holes. For example, FIG. 5(C) depicts an exemplary single L-shaped through-hole 137b, FIG. 5(D) depicts an example with four smaller round through-holes 137c, and FIG. 5(E) depicts an example with one longitudinal through-hole 137d and two smaller round through-holes 137e.

Figure 6A:
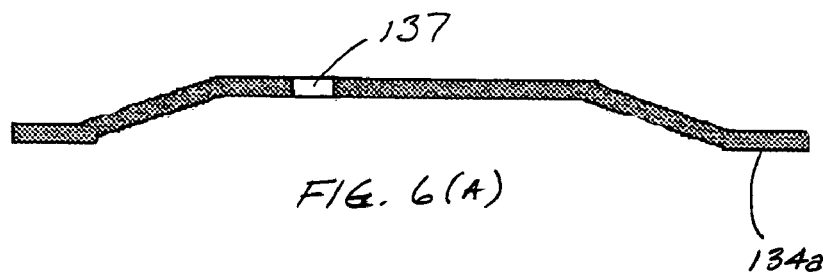
FIG. 6(A) is a side-sectional view of a Type II heat-spreader including an exemplary through-hole used in the instant methods.
Figure 6B:
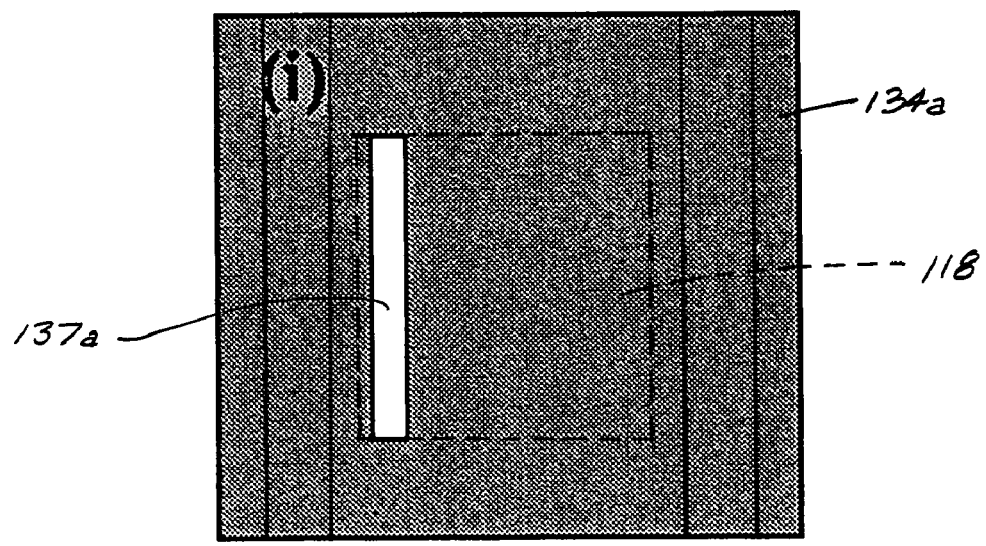
FIG. 6(B) is a plan view of the heat-spreader in FIG. 6(A).
Figure 6D:
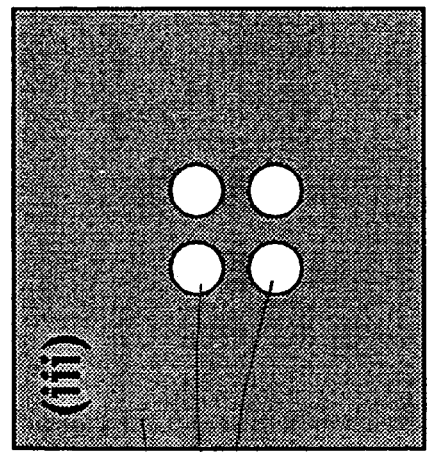
FIGS. 6(C)-6(E) are plan views of respective heat-spreaders with different exemplary configurations of through-holes that can be used in the instant methods.
Figure 6C:
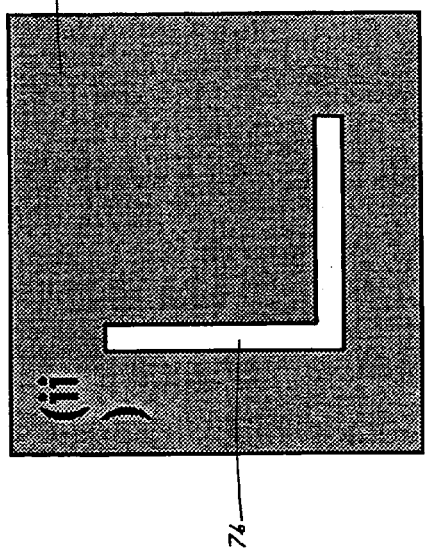
Figure 6E:
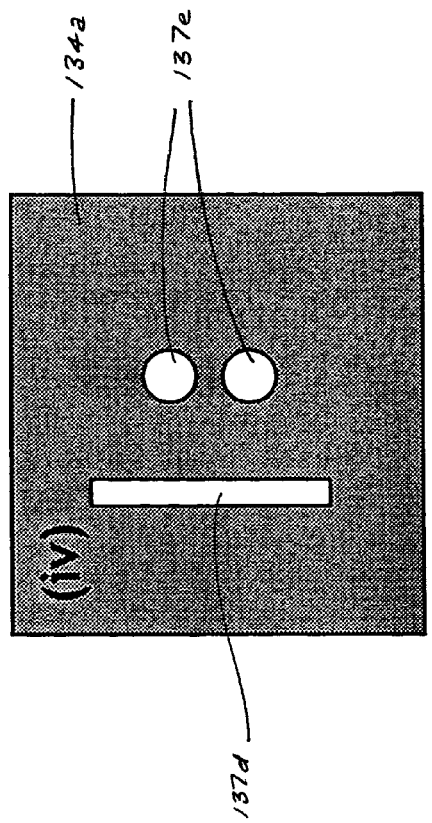

In an alternative embodiment, FIG. 6(A) depicts a side view of a Type II heat-spreader 134a. A through-hole 137 is shown. A plan view is shown in FIG. 6(B), which depicts an exemplary longitudinal through-hole (now denoted as item 137a). Note the approximate position of the through-hole 137a relative to the outline of the die 118 situated underneath. Introducing the TIM via the through-hole 137a to the die 118 allows even and thorough flow of the TIM into the entire gap 135 between the die and the heat-spreader 134. Whereas FIG. 6(B) depicts one exemplary through-hole, other possible configurations comprise multiple through-holes. For example, FIG. 6(C) depicts an exemplary single L-shaped through-hole 137b, FIG. 6(D) depicts an example with four smaller round through-holes 137c, and FIG. 6(E) depicts an example with one longitudinal through-hole 137d and two smaller round through-holes 137e.

Figure 6F:
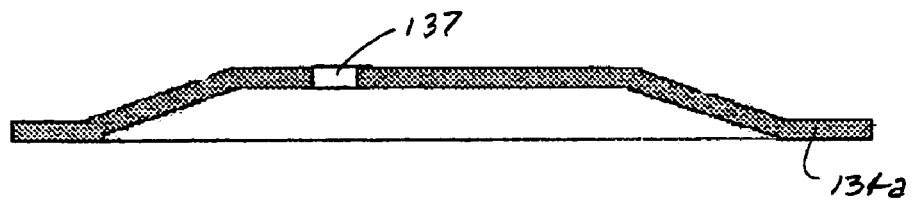
FIGS. 6(F)-6(G) are a side-sectional view and a plan view, respectively, of an alternative configuration to that shown in FIGS. 6(A)-6(B), wherein the configuration of FIGS. 6(F)-6(G) is "U-shaped" in two dimensions rather than in one dimension as depicted in FIGS. 6(A)-6(B).
Figure 6G:
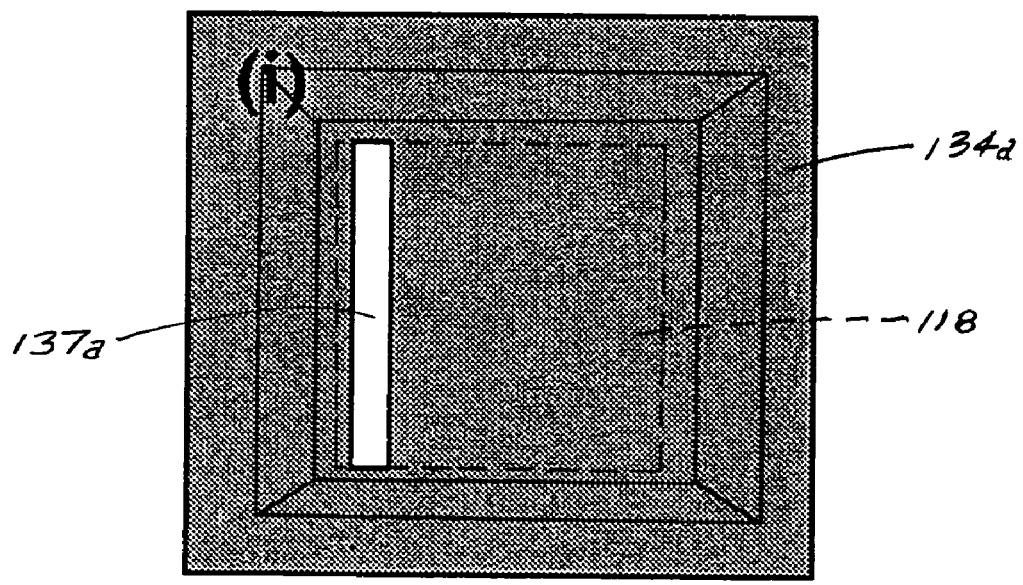
Figure 7:
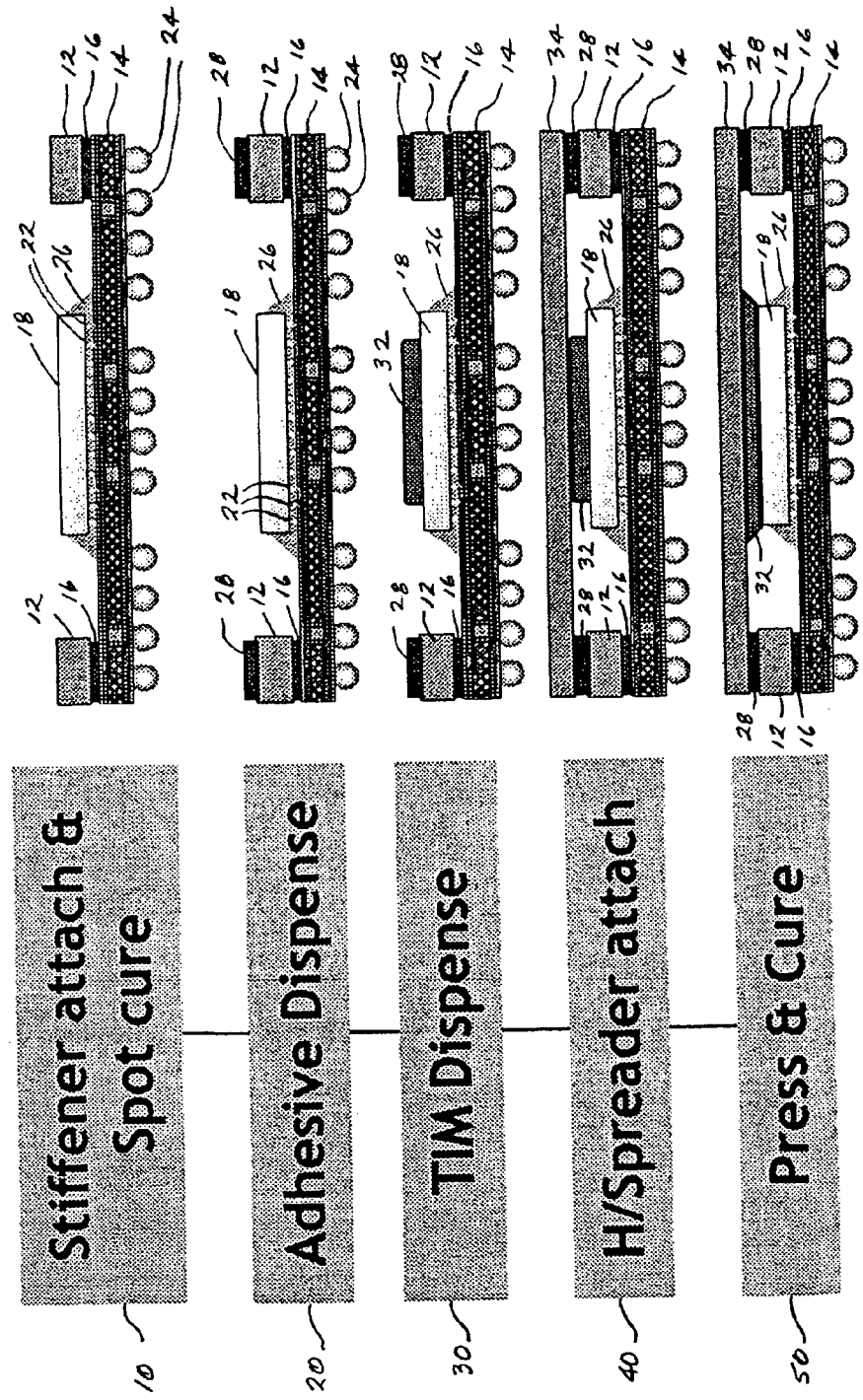
FIG. 7 provides, on the left side, a block-diagram flow chart of a conventional method for attaching the heat-spreader to the substrate and top surface of the die. On the right side are schematic vertical sections depicting the results of respective steps listed on the left.
Figure 8A:
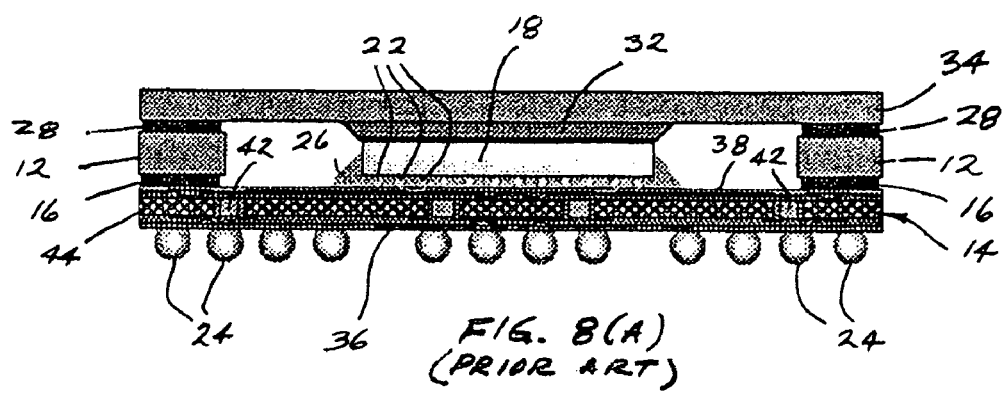
FIG. 8(A) depicts, in larger form, the result of step 50 of the method of FIG. 7, performed with a Type I (planar) heat-spreader.
Figure 8B:
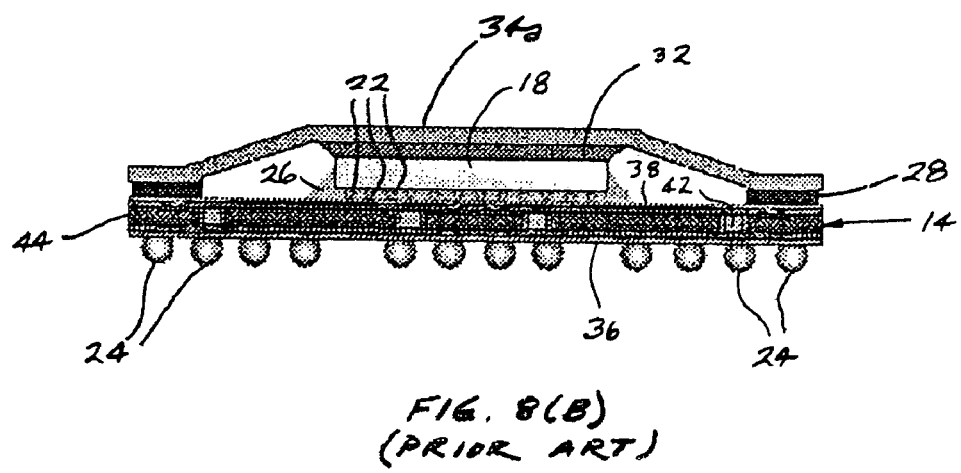
FIG. 8(B) depicts, in larger form, the result of step 50 of the method of FIG. 7, performed with a Type II (inverted U-shaped) heat-spreader.

FIGS. 6(F)-6(G) are a side-sectional and a plan view, respectively, of an alternative configuration to that shown in FIGS. 6(A)-6(B). Notably, the configuration of FIGS. 6(F)-6(G) is "U-shaped" in two dimensions (x and y) rather than in one dimension (x or y) as depicted in FIGS. 6(A)-6(B). The examples shown in FIGS. 6(C)-6(E) are equally applicable to the configuration of FIGS. 6(F)-6(G) as they are to the configuration of FIGS. 6(A)-6(B).

Whereas the invention has been described in connection with representative embodiments, it is not limited to those embodiments. On the contrary, the invention is intended to encompass all modifications, alternatives, and equivalents as may be included within the spirit and scope of the invention as defined by the appended claims.

What is claimed is:

1. An integrated circuit package, comprising:
a chip comprising a first surface and an active second surface;
a substrate having a first surface and a second surface, wherein the chip is mounted, in a flip-chip manner, onto the substrate such that the active second surface of the chip is facing the first surface of the substrate, and electrical connections are formed between the active second surface of the chip and the first surface of the substrate;
a heat-spreader, defining at least one through hole having a side extended across the entire lateral dimension of the chip and the side extended longitudinally parallel to the outline of the chip, coupled to the first surface of the chip and to the first surface of the substrate such that the at least one through-hole is situated within a perimeter of the chip and a gap is defined between the chip and the heat-spreader; and
thermal-interface material (TIM) situated within the gap so as to form a thermal connection between the chip and the heat spreader, the thermal-interface material in the at least one of the through hole.

2. The integrated circuit package of claim 1, wherein the electrical connections comprise a ball-grid array.

3. The integrated circuit package of claim 1, wherein the heat-spreader defines multiple through-holes each situated within the perimeter of the chip.

4. An electronic device, comprising the integrated circuit package as recited in claim 1.

5. The integrated circuit package of claim 1, further comprising a stiffener situated between and mounted to the first surface of the heat-spreader and the first surface of the substrate outside the perimeter of the chip.

6. The integrated circuit package of claim 5, further comprising a first adhesive situated between the stiffener and the first surface of the substrate and a second adhesive situated between the stiffener and the heat-spreader.

7. The integrated circuit package of claim 5, wherein the heat-spreader is a Type I heat-spreader.

8. The integrated circuit package of claim 1, wherein the heat-spreader is coupled directly to the first surface of the substrate using an adhesive.

9. The integrated circuit package of claim 8, wherein the heat-spreader is a Type II heat-spreader.

10. A method for attaching a heat-spreader to an integrated circuit package, comprising:
applying an adhesive to selected regions of the substrate not occupied by a flip-chip, the flip-chip having an active-surface facing downward, the flip-chip mounted onto an upward-facing surface of the substrate such that a back-side of the flip-chip is facing upward;
placing a heat-spreader so as to contact the applied adhesive without contacting the back-side of the flip-chip, thereby leaving a gap between the heat-spreader and the back-side of the flip-chip, the heat-spreader defining at least one through-hole that, when the heat-spreader is placed, is situated within a perimeter of the flip-chip, the through-hole having a side extended across the entire lateral dimension of the flip-chip and the side extended longitudinally parallel to the outline of the flip-chip;
curing the adhesive; and
applying a thermal-interface material (TIM) through the at least one through-hole so as to fill the gap with the TIM, the thermal-interface material in the at least one of the through hole.

11. A method for fabricating an integrated circuit package, comprising:
mounting a flip-chip, active-surface facing downward, onto a substrate such that a back-side of the flip-chip is facing upward and requisite electrical connections are made between the chip and an upward-facing surface of the substrate;
applying an adhesive to selected regions of the substrate not occupied by the flip-chip;
placing a heat-spreader so as to contact the applied adhesive without contacting the back-side of the flip-chip, thereby leaving a gap between the heat-spreader and the back-side of the flip-chip, the heat-spreader defining at least one through-hole having a side extended across the entire lateral dimension of the flip-chip and the side longitudinally parallel to the outline of the flip-chip that, when the heat-spreader is placed, is situated within a perimeter of the flip-chip;
curing the adhesive; and
applying a thermal-interface material (TIM) through the at least one through-hole so as to fill the gap with the TIM, the thermal-interface material in the at least one of the through hole.

12. The method of claim 11, further comprising, during the step of mounting the flip-chip onto the substrate, applying an underfill material at least between the active-surface and the substrate.

13. The method of claim 11, wherein the step of mounting the flip-chip onto the substrate further comprises making solder connections between the active-surface of the flip-chip and the substrate.

14. The method of claim 11, wherein the step of mounting the flip-chip onto the substrate further comprises:
applying solder balls to selected locations on the active surface of the flip-chip to produce a ball-grid array on the active surface; and
causing the solder balls to form respective connections to corresponding locations on the upward-facing surface of the substrate.

15. The method of claim 11, further comprising, during the step of curing the adhesive, pressing the heat-spreader toward the back-side of the flip-chip but not contacting the back-side.

16. The method of claim 11, wherein the step of applying an adhesive to selected regions comprises applying the adhesive to selected regions of the upward-facing surface of the substrate.

17. The method of claim 11, further comprising the step, before or after mounting the flip-chip onto the substrate, of attaching a stiffener to the substrate at a location outside the perimeter of the chip.

18. The method of claim 17, wherein the stiffener is attached to the substrate using an adhesive.

19. The method of claim 17, wherein:
the step of applying an adhesive to selected regions comprises applying the adhesive to a top surface of the stiffener attached to the substrate; and
the step of placing the heat-spreader comprises placing the heat-spreader so as to contact the applied adhesive on the top-surface of the stiffener.

* * * * *